United States Patent [19]
Chung et al.

[11] Patent Number: 6,101,047
[45] Date of Patent: Aug. 8, 2000

[54] CATADIOPTRIC OPTICAL SYSTEM FOR LITHOGRAPHY

[75] Inventors: Hai Bin Chung; Jong Soo Kim; Kag Hyeon Lee; Doh Hoon Kim; Sang Soo Choi; Hyung Joun Yoo, all of Daejeon, Rep. of Korea

[73] Assignee: Electronics and Telecommunications Research Institute, Daejeon, Rep. of Korea

[21] Appl. No.: 09/132,303

[22] Filed: Aug. 11, 1998

[30] Foreign Application Priority Data

Oct. 7, 1997 [KR] Rep. of Korea ................ 97-51435

[51] Int. Cl.[7] .................................................. G02B 17/00
[52] U.S. Cl. ............................................ 359/726; 359/727
[58] Field of Search .................................. 359/726, 727, 359/733, 734

[56] References Cited

U.S. PATENT DOCUMENTS

| | | | |
|---|---|---|---|
| 5,212,593 | 5/1993 | Williamson et al. | 359/487 |
| 5,241,423 | 8/1993 | Chiu et al. | 359/727 |
| 5,400,179 | 3/1995 | Ito | 359/588 |
| 5,402,267 | 3/1995 | Furter et al. | 359/727 |
| 5,625,491 | 4/1997 | von Gunten et al. | 359/487 |
| 5,638,218 | 6/1997 | Oomura | 359/727 |
| 5,668,672 | 9/1997 | Oumura | 359/727 |
| 5,880,891 | 3/1999 | Furter | 359/726 |

OTHER PUBLICATIONS

Michael Hibbs, "193–nm lithography at MIT Lincoln Lab", Solid State Technology, Jul. 1995, pp. 69–77.

David Williamson et al., "Micrascan III, 0.25μm resolution step and scan system", SPIE, vol. 2726, pp. 780–786.

Li Li et al., "Visible broadband, wide–angle, thin–film multilayer polarizing beam splitter", Applied Optics, vol. 35, No. 13, May 1, 1996, pp. 2221–2225.

*Primary Examiner*—Loha Ben
*Attorney, Agent, or Firm*—Jacobson, Price, Holman & Stern, PLLC

[57] ABSTRACT

Provided with an optical system which is applicable to an exposure apparatus used in the manufacture of semiconductors and includes a combination of a spherical mirror having a function of refraction and lenses for astigmation control, using a $CaF_2$ lens as the last lens, thereby making it possible to use a light source operating at a short wavelength and a wide bandwidth, enhance the life of the optical system, and transfer the enlarge pattern of a mask onto the wafer for realizing fine line width.

4 Claims, 4 Drawing Sheets

CATADIOPTRIC OPTICAL SYSTEM FOR LITHOGRAPHY

BACKGROUND OF THE INVENTION

1. Field of the Invention

The present invention relates to an optical system of exposure apparatuses used in the manufacture of a semiconductor device and, more particularly, to a catadioptric optical system for lithography including a spherical mirror and lenses for transferring a pattern from an enlarged original mask onto a wafer using an ArF excimer laser as a light source, thereby realizing a very fine line width.

2. Description of the Prior Art

As the integration of the semiconductor devices with enlarged capacity has been improved, there is an increase in the demand for a highly fine pattern constituting a circuitry and a large chip size. In order to satisfy such a demand, there have been occurred necessities for higher performance of exposure apparatuses used in the semiconductor exposure process. The line width realized by exposure apparatuses fundamentally depends upon the resolution of optical system. The resolution of optical system in an exposure apparatus is proportional to the wavelength of a light source used and in an inverse proportion to the numerical aperture of optical system. In order to obtain a very fine pattern, therefore, it is necessary to use a light source having a short wavelength or to increase the numerical aperture of optical system. An increase in the numerical aperture of optical system is disadvantageous in regards to process and design of the optical system in that the depth of focus becomes small. For this reason, decreasing the wavelength of light source is preferable. However, where a short-wavelength ultraviolet light source is used, there is a limitation upon optical materials.

A conventional dioptric optical system for lithography is constituted by lenses only, and has to employ fused quartz exclusively as an optical material, which causes an astigmation. It is thus required to use a light source which operates in a short bandwidth enough to be acceptable with astigmation, in order to solve the above-mentioned problem. Other disadvantages involving such a conventional dioptric optical system are a rapid decline in the total transmittance of the optical system resulting from a loss of light since fused quartz exhibits a high absorptance, and a deterioration of the optical material by light source, thereby causing a defect in the fused quartz and reducing the life of optical system.

SUMMARY OF THE INVENTION

Accordingly, an object of the present invention is to provide a catadioptric optical system which is applicable to an exposure apparatus used in the manufacture of semiconductors and includes a spherical mirror and other lenses, for transferring the pattern on a mask to a wafer using an ArF excimer laser as a light source so as to realize a fine line width.

In accordance with an aspect of the present invention, a catadioptric optical system for lithography, which is used to expose a wafer to a light in fabricating a semiconductor, includes: a first lens group disposed at the rear end of a light source, and performing an astigmation control on a mask irradiated by the light source; a folding mirror for changing the direction of the radiation having passed through the first lens group; a second lens group disposed at the end of the folding mirror, and having a function of performing an astigmation control for the refracted radiation and focussing the radiation; a polarized beam splitter disposed at the rear end of the second lens group, and reflecting an incident polarized beam of the light source having passed through the second lens group; a first wave plate disposed on the polarized beam splitter, converting the linearly polarized beam reflected from the polarized beam splitter to a circularly polarized beam, and converting the circularly polarized beam to the linearly polarized beam again; a spherical mirror for reflecting the circularly polarized beam having passed through the first wave plate; a second wave plate for converting the linearly polarized beam having passed through the first wave plate to a circularly polarized beam; and a third lens group for performing the final astigmation control for the circularly polarized beam having passed through the second wave plate, and transferring information on a mask to the wafer.

This construction enables us to use a light source operating at a short wavelength and a wide bandwidth, enhance the life of the optical system, and transfer the enlarge pattern of a mask onto the wafer for realizing fine line width.

Other features and advantages of the present invention will be apparent from the following description taken in conjunction with the accompanying drawings.

BRIEF DESCRIPTION OF THE ATTACHED DRAWINGS

DETAILED DESCRIPTION OF PREFERRED EMBODIMENT

Hereinafter, the preferred embodiments of the present invention will be described with reference to the accompanying drawings.

Figure 1:
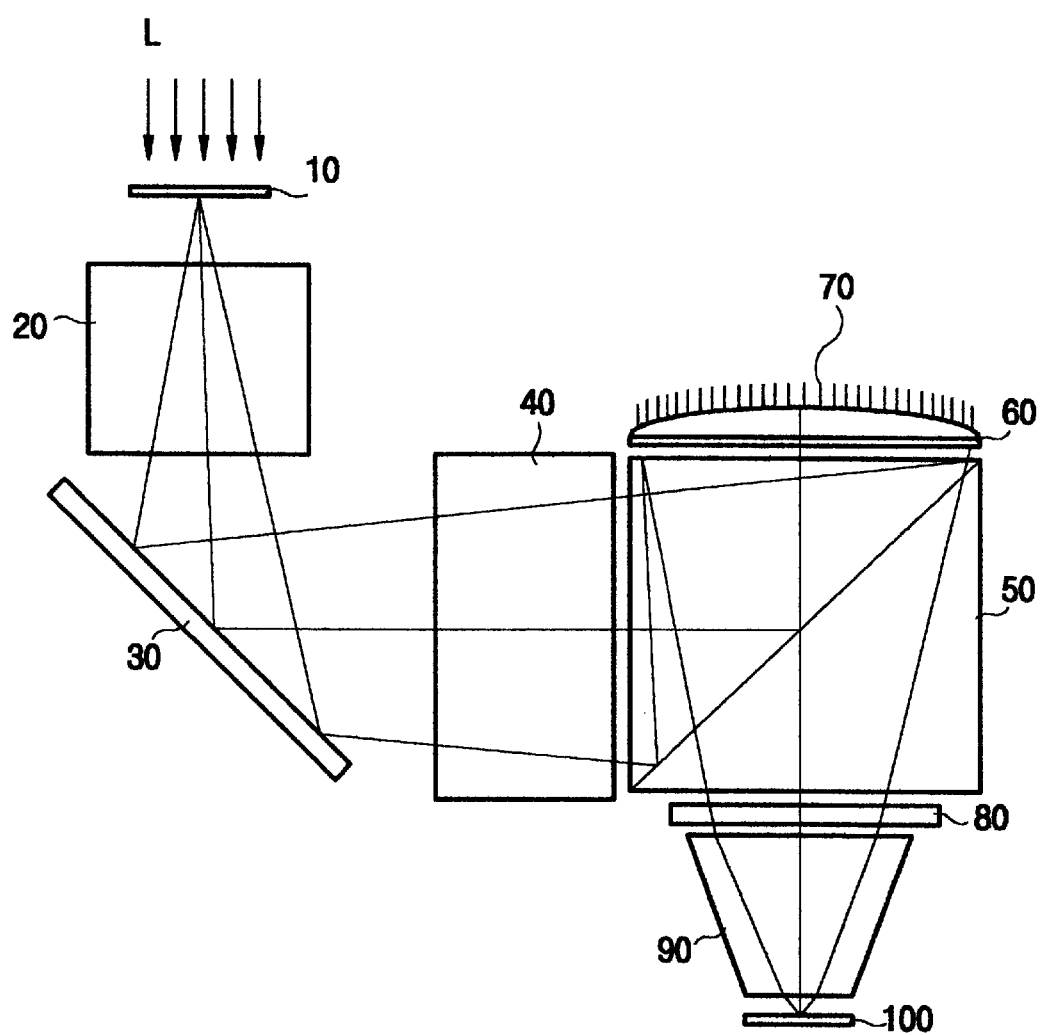
FIG. 1 is a schematic view of a catadioptric optical system in accordance with the present invention.

FIG. 1 is a schematic view showing a configuration of a catadioptric optical system in accordance with the present invention.

First, as shown in FIG. 1, the radiation from a light source is incident on an enlarged original mask 10 uniformly via an illumination optical system. Information on the mask 10 is then corrected for astigmation by the radiation passing through a first lens group 20. A folding mirror 30 disposed at the rear end of the first lens group 20 changes the direction of radiation by 90 degrees. The radiation passing through a second lens group 40 provides an astigmation control and is focused. A polarized beam splitter 50 disposed at the rear end of the second lens group 40 causes an incident polarized beam from the light source to reflect. A first wave plate 60 is disposed on the polarized beam splitter 50. The first wave plate 60 converts the linearly polarized beam reflected from the polarized beam splitter 50 to a circularly polarized beam. A spherical mirror 70 reflects the circularly polarized beam having passed through the first wave plate 60 to the first wave plate 60. Passing through the first wave plate 60, the circularly polarized beam is changed back to the linearly polarized beam and is incident upon a second wave plate 80 via the polarized beam splitter 50. The second wave plate 80 converts the incident polarized beam to a circularly polarized beam. Passing through the second wave plate 80, the circularly polarized beam provides the final astigmation control, so that the pattern on the mask is transferred to the surface of a wafer 100. This makes it possible to realize fine line width on the wafer. The optical system used herein is a scanning type catadioptric optical system having the exposure area of 26×5 mm$^2$ and using an ArF excimer laser of 193.3 nm in wavelength as a light source, where the magnification of the whole system is ¼ (reduction) and the numerical aperture is 0.55.

Figure 2:
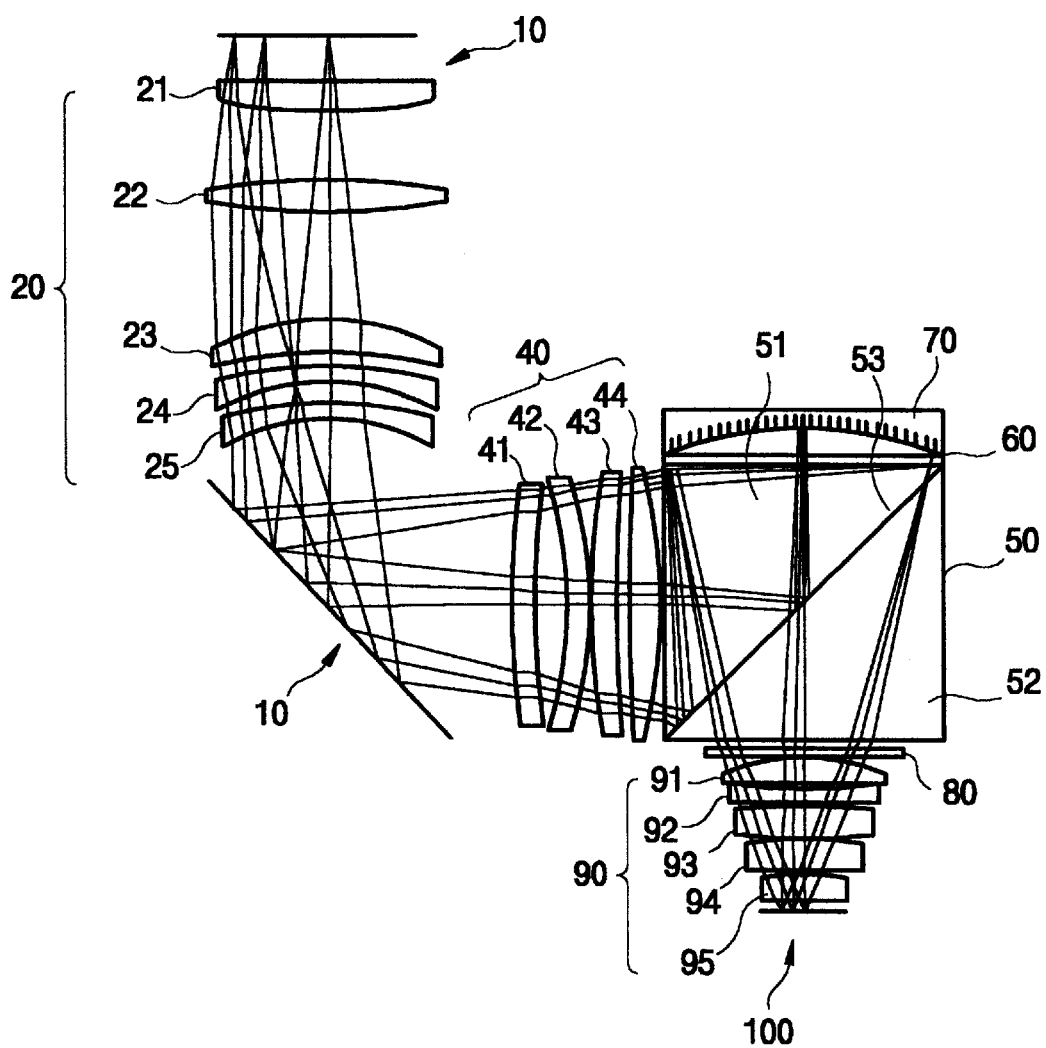
FIG. 2 is a detailed view of the catadioptric optical system in accordance with the present invention.

FIG. 2 is a detailed view showing a configuration of the catadioptric optical system in accordance with the present invention.

Referring to FIG. 2, the radiation from an ArF excimer laser having a wavelength of 193.9 nm is first incident on the mask 10 uniformly via an illumination optical system. Passing through the first lens group 20 including five lenses 21–25 made of fused quartz, the radiation allows an astigmation control of the information in the mask 10. The folding mirror 30 changes the direction of radiation by 90 degrees, and the second lens group 40 including four lenses 41–44 made of fused quartz performs an astigmtion control and focuses the radiation. The polarized beam splitter 50, which is disposed at the rear end of the second lens group 40 and includes two right-angled prisms 51 and 52, causes an incident polarized beam generated from the light source to be reflected from a beam split face 53, that is, an area where the two prisms 51 and 52 abut each other. The first wave plate 60 disposed on the polarized beam splitter 50 converts the linearly polarized beam reflected from the polarized beam splitter 50 to a circularly polarized beam. The spherical mirror 70 reflects the circularly polarized beam having passed through the first wave plate 60 to the first wave plate 60. The first wave plate 60 converts the circularly polarized beam back to the linearly polarized beam. After passing through the first wave plate 60, the linearly polarized beam enters the second wave plate 80 via the polarized beam splitter 50. The second wave plate 80 changes the incident polarized beam into a circularly polarized beam. The circularly polarized beam having passed through the second wave plate 80 is subjected to the final astigmation control at the third lens group 90 which includes four lenses 91–94 made of fused quartz and one CaF$_2$ lens 95. After this, the pattern on the mask 10 is transferred to the wafer.

Table 1 lists the preferred constructional parameters of the embodiment of a catadioptric optical system. Table 1 lists the components of the catadioptric optical system, the thickness, the distance from the previous lens, and the radius of a curvature.

TABLE 1

| DIV. | LENS | FACE | RADIUS OF CURVATURE (mm) | THICKNESS (mm) | INDEX OF REFRACTION | INTERVAL (mm) |
|---|---|---|---|---|---|---|
| MASK SURFACE | | | UNLIMITED | | | 23.000 |
| 1st LENS GROUP 20 | 1st LENS 21 | FRONT | 783.166 | 16.00 | 1.560294 | |
| | | BACK | −515.921 | | | 37.000 |
| | 2nd LENS 22 | FRONT | 352.768 | 18.600 | 1.560294 | |
| | | BACK | −777.475 | | | 58.500 |
| | 3rd LENS 23 | FRONT | 121.651 | 18.000 | 1.560294 | |
| | | BACK | 251.178 | | | 8.800 |
| | 4th LENS 24 | FRONT | 409.772 | 8.200 | 1.560294 | |
| | | BACK | 163.421 | | | 9.000 |
| | 5th LENS 25 | FRONT | 211.582 | 8.038 | 1.560294 | |
| | | BACK | 111.743 | | | 204.700 |
| 2nd LENS GROUP 40 | 6th LENS 41 | FRONT | 784.023 | 9.500 | 1.560294 | |
| | | BACK | 459.714 | | | 22.800 |
| | 7th LENS 42 | FRONT | −187.597 | 9.000 | 1.560294 | |
| | | BACK | −289.859 | | | 0.500 |
| | 8th LENS 43 | FRONT | 412.963 | 15.100 | 1.560294 | |
| | | BACK | 734.600 | | | 9.300 |
| | 9th LENS 44 | FRONT | UNLIMITED | 15.500 | 1.560294 | |
| | | BACK | −440.338 | | | 5.000 |
| POLARIZED BEAM SPLITTER 50 | | FRONT | UNLIMITED | 75.000 | 1.560294 | |
| | | BACK | UNLIMITED | 75.000 | 1.560294 | 2.000 |
| 1st WAVE PLATE 60 | | UPPER | UNLIMITED | 6.000 | 1.560294 | |
| | | LOWER | UNLIMITED | | | 2.000 |
| SPHERICAL MIRROR 70 | | | −305.965 | | | 10.013 |
| 2nd WAVE PLATE 80 | | UPPER | UNLIMITED | 6.000 | 1.560294 | |
| | | LOWER | UNLIMITED | | | 2.000 |
| 3rd LENS GROUP 90 | 10th LENS 91 | FRONT | 105.500 | 11.950 | 1.560294 | |
| | | BACK | 417.322 | | | 5.200 |
| | 11th LENS 92 | FRONT | −295.611 | 7.200 | 1.560294 | |
| | | BACK | UNLIMITED | | | 2.242 |
| | 12th LENS 93 | FRONT | 353.817 | 17.033 | 1.560294 | |
| | | BACK | −791.855 | | | 1.200 |
| | 13th LENS 94 | FRONT | 417.369 | 18.000 | 1.560294 | |
| | | BACK | −787.124 | | | 2.100 |
| | 14th LENS 95 | FRONT | 252.726 | 12.400 | 1.5010724 | |
| | | BACK | 702.015 | | | 6.205 |

As can be seen from Table 1, the use of thin lenses enables us to obtain high transmission of the whole optical system, high resolution uniform over the exposure area, and wide defocussing range.

Figure 3:
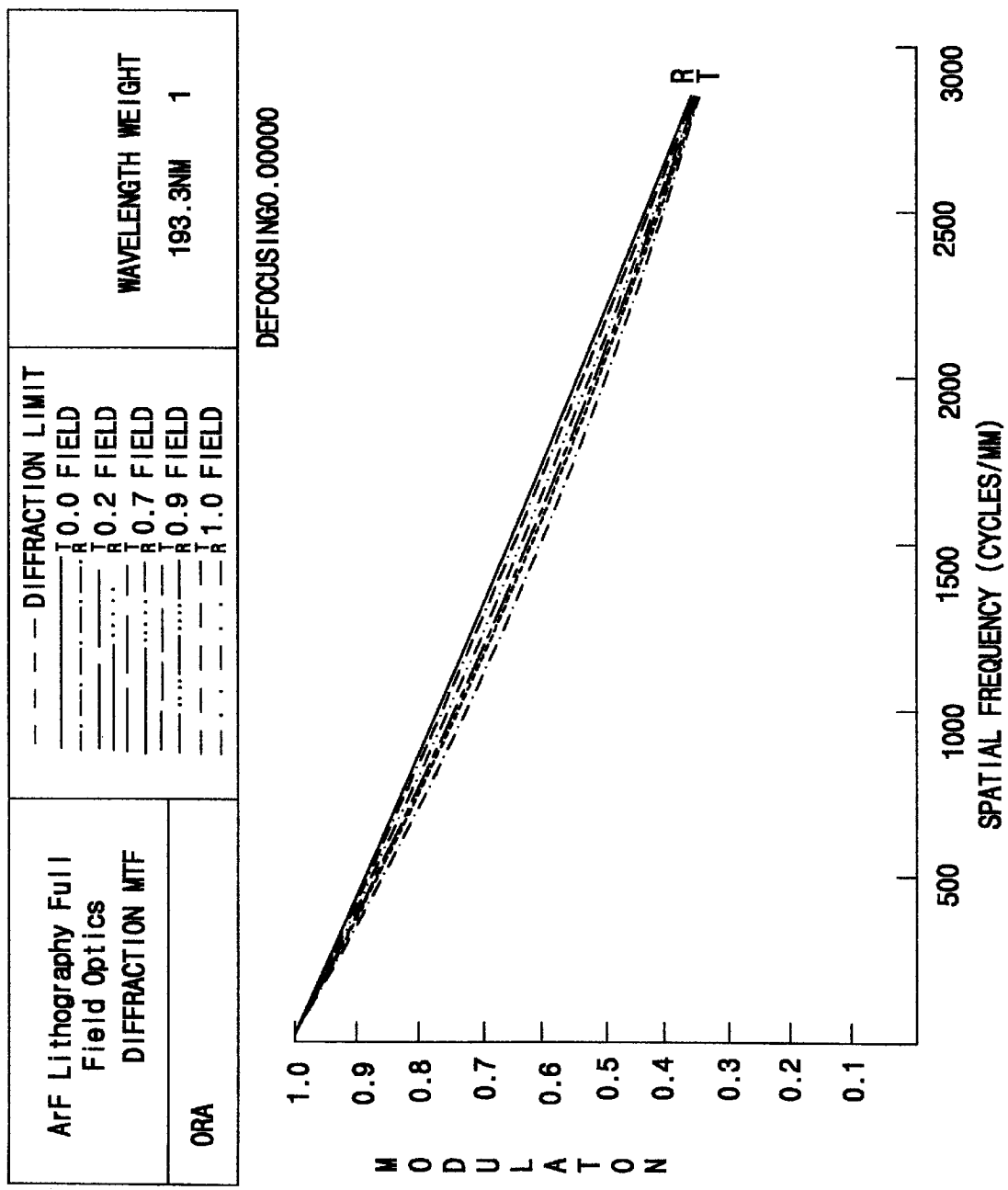
FIG. 3 is a plot of the modulation transfer function (MTF) as a function of spatial frequency for the catadioptric optical system according to the present invention.

FIG. 3 is a plot of the modulation transfer function (MTF) as a function of spatial frequency for the catadioptric optical system according to the present invention. FIG. 3 gives the MTF for both tangential and sagittal features at a spatial frequency of 3000 cycles/mm for each focussing position; a point (0.0 field); second, third and fourth points at 0.2, 0.7 and 0.9 of the full half field away from the point, respectively; and a fifth point at the full field away from the point. As shown in FIG. 3, the modulation transfer functions for the tangential and sagittal features at these five points are almost identical and a high resolution is obtained uniformly all over the field.

Figure 4:
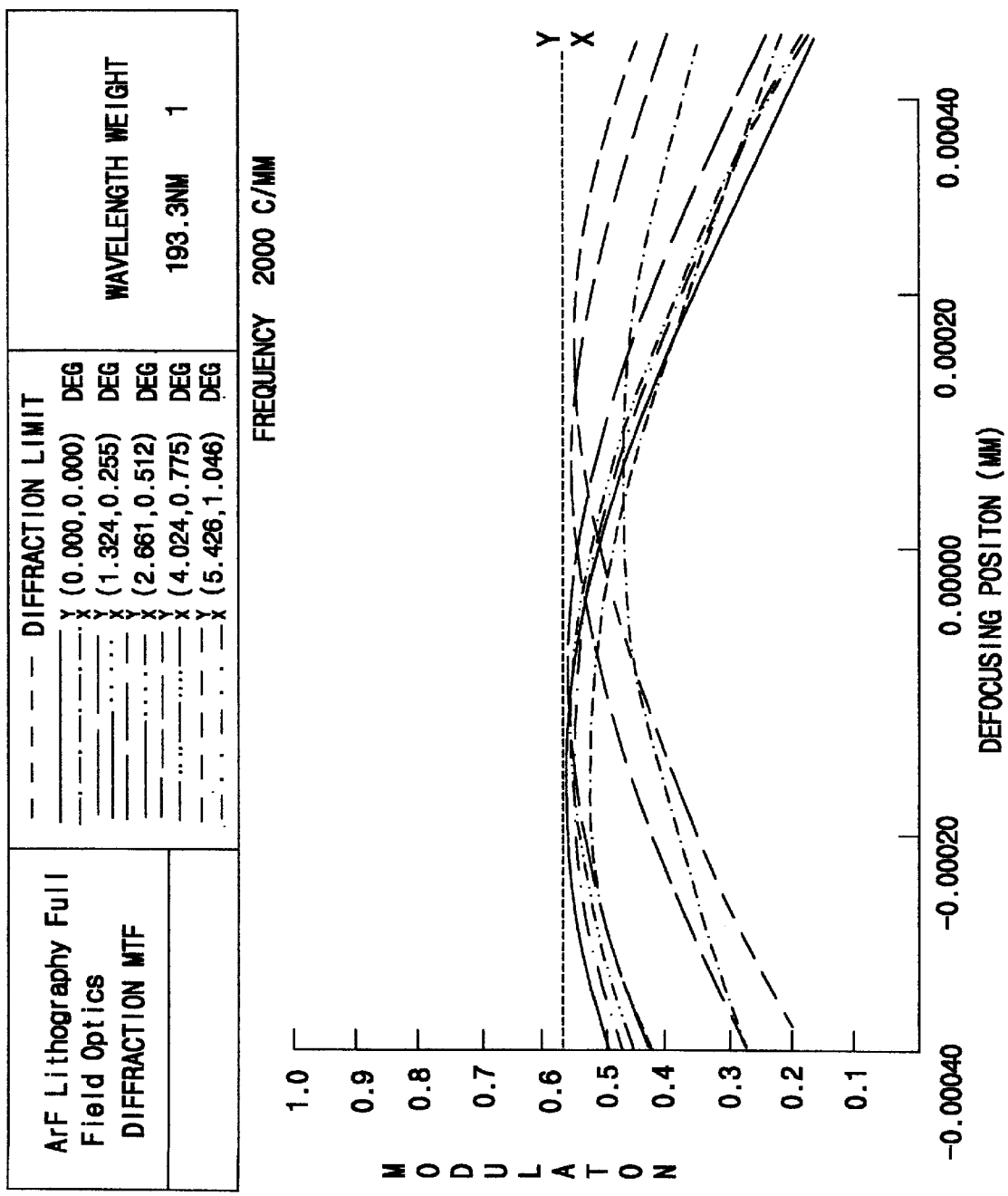
FIG. 4 is a plot of the modulation transfer function (MTF) for each focusing position at a spatial frequency of 2000 cycles/mm in the catadioptric optical system of the present invention.

FIG. 4 is a plot of the modulation transfer function (MTF) for both tangential and sagittal features at a spatial frequency of 2000 cycles/mm for each focussing position, where a defocussing range is obtained from the modulation transfer function.

Such as in the present invention as described above, an optical system is provided which has a combination of a spherical mirror having a function of refraction and lenses for performing an astigmation control and uses a $CaF_2$ lens as the last lens, thereby making it possible to use a light source operating at a short wavelength and a wide bandwidth, enhance the life of the optical system, and transfer the enlarge pattern of a mask onto the wafer for realizing fine line width. Furthermore, using thin lenses present other advantages such as high resolution uniformly achieved all over the exposure area and high transmission of the whole optical system, wide defocussing range.

What is claimed is:

1. A catadioptric optical system for lithography, which is used to expose a wafer to a light in fabricating a semiconductor, the catadioptric optical system comprising:

a first lens group disposed at the rear end of a light source, and performing an astigmation control on a mask irradiated by the light source;

a folding mirror for changing the direction of the radiation having passed through the first lens group;

a second lens group disposed at the end of the folding mirror, and having a function of performing an astigmation control for the refracted radiation and focussing the radiation;

a polarized beam splitter disposed at the rear end of the second lens group, and reflecting an incident polarized beam of the light source having passed through the second lens group;

a first wave plate disposed on the polarized beam splitter, converting the linearly polarized beam reflected from the polarized beam splitter to a circularly polarized beam, and converting the circularly polarized beam to the linearly polarized beam again;

a spherical mirror for reflecting the circularly polarized beam having passed through the first wave plate;

a second wave plate for converting the linearly polarized beam having passed through the first wave plate to a circularly polarized beam; and a third lens group for performing the final astigmation control for the circularly polarized beam having passed through the second wave plate, and transferring information on a mask to the wafer.

2. The catadioptric optical system as defined in claim 1, wherein third lens group comprises four lenses made of fused quartz as an optical material, and one lens made of $CaF_2$.

3. The catadioptric optical system as defined in claim 2, wherein the lenses of the third lens group are 252.726 mm and 702.015 mm in the radius of a curvature for the front and back faces thereof, respectively, and have a thickness of 12.400 mm, an index of refraction of 1.5010724 and the spacing between the two adjacent lenses being 6.205 mm.

4. The catadioptric optical system as defined in claim 1, wherein the polarized beam splitter comprises two right-angled prisms, each prism having a size of 150×150× 150 $mm^3$, the prisms being differentiated in the length of one face.

* * * * *